United States Patent
Chou

(10) Patent No.: US 7,839,633 B2
(45) Date of Patent: Nov. 23, 2010

(54) FOLDABLE COMPUTER CHASSIS

(75) Inventor: Chuan-Chang Chou, Taipei (TW)

(73) Assignee: Asustek Computer Inc., Taipei (TW)

( * ) Notice: Subject to any disclaimer, the term of this patent is extended or adjusted under 35 U.S.C. 154(b) by 79 days.

(21) Appl. No.: 12/398,558

(22) Filed: Mar. 5, 2009

(65) Prior Publication Data

US 2009/0268399 A1 Oct. 29, 2009

(30) Foreign Application Priority Data

Apr. 29, 2008 (TW) .............................. 97115787 A

(51) Int. Cl.
*H05K 5/00* (2006.01)
*H05K 7/00* (2006.01)
(52) U.S. Cl. .............................. 361/679.6; 361/679.02; 361/679.58; 312/223.2
(58) Field of Classification Search ............ 361/679.02, 361/679.58, 679.6; 312/223.2
See application file for complete search history.

(56) References Cited

U.S. PATENT DOCUMENTS

| 6,042,333 | A | 3/2000 | Day | |
|---|---|---|---|---|
| 6,097,591 | A | 8/2000 | Ircha | |
| 6,354,681 | B1 | 3/2002 | Nemec | |
| 6,870,739 | B2 * | 3/2005 | Groos et al. | 361/725 |
| 7,151,672 | B2 | 12/2006 | Campbell | |
| 7,518,866 | B2 * | 4/2009 | Cheng et al. | 361/697 |
| 2006/0215358 | A1 * | 9/2006 | Campbell | 361/683 |
| 2007/0228900 | A1 | 10/2007 | Cheng et al. | |
| 2007/0241647 | A1 | 10/2007 | Cheng et al. | |
| 2007/0242422 | A1 | 10/2007 | Cheng et al. | |
| 2007/0252495 | A1 | 11/2007 | Cheng et al. | |
| 2007/0253154 | A1 | 11/2007 | Cheng et al. | |
| 2007/0253155 | A1 | 11/2007 | Cheng et al. | |

(Continued)

FOREIGN PATENT DOCUMENTS

CN 101051240 10/2007

(Continued)

OTHER PUBLICATIONS

English language translation of abstract of CN 101051240 (published Oct. 10, 2007).

(Continued)

*Primary Examiner*—Jayprakash N Gandhi
*Assistant Examiner*—Anthony M Haughton
(74) *Attorney, Agent, or Firm*—Thomas, Kayden, Horstemeyer & Risley

(57) ABSTRACT

A foldable computer chassis includes a first plate having multiple first fixing shafts and second fixing shafts, multiple second plates connected to two opposite edges of the first plate by the first fixing shafts, and multiple third plates movably and rotatably connected to the other two opposite edges of the first plate by the second fixing shafts. Each third plate has a fixing elastic element. When the computer chassis is folded, the second plates are rotated to lie on the first plate, and the third plates are moved and rotated to lie on the second plates. When the computer chassis is assembled, the second plates are rotated to stand on the first plate, and the third plates are moved and rotated to stand on the first plate. The fixing elastic elements on the third plates are provided for fastening the second plates with the third plates.

13 Claims, 10 Drawing Sheets

U.S. PATENT DOCUMENTS

2007/0253156 A1 11/2007 Cheng et al.
2007/0262681 A1 11/2007 Cheng et al.
2008/0002349 A1 1/2008 Cheng et al.

FOREIGN PATENT DOCUMENTS

| CN | 101071326 | 11/2007 |
| EP | 1 843 236 | 10/2007 |
| TW | 212597 | 9/1993 |
| TW | 200739326 | 10/2007 |

OTHER PUBLICATIONS

English language translation of abstract of CN 101071326 (published Nov. 14, 2007).

English language translation of abstract of TW 200739326 (published Oct. 16, 2007).

* cited by examiner

US 7,839,633 B2

FOLDABLE COMPUTER CHASSIS

This application claims the benefit of Taiwan application Ser. No. 97115787, filed Apr. 29, 2008, the subject matter of which is incorporated herein by reference.

BACKGROUND OF THE INVENTION

1. Field of the Invention

The invention relates to a computer chassis and, more particularly, to a foldable computer chassis.

2. Description of the Related Art

A conventional computer chassis has an unchangeable structure which is unfoldable or difficult to be minified. As a result, it's difficult to adjust the space occupied by the computer chassis in transporting or storing, the transportation cost is increased, and the storage space also cannot be optimized.

In addition, at present, a screw locking mode is employed to assemble the computer chassis, and all parts should be arranged and aligned with each other correctly before screws or other locking elements are locked. Therefore, it is complicated, time-consuming and laborious to assemble a computer chassis.

BRIEF SUMMARY OF THE INVENTION

A foldable computer chassis includes a first plate, a plurality of second plates, and a plurality of third plates. The first plate has a plurality of first fixing shafts and second fixing shafts. The second plates are rotatably connected to two opposite edges of the first plate by the first fixing shafts, respectively. The third plates are movably and rotatably connected to the other two opposite edges of the first plate by the second fixing shafts, respectively. Each of the third plates has a fixing elastic element. When the computer chassis is folded, the second plates are rotated to lie on the first plate, and the third plates are moved and rotated to lie on the second plates. When the computer chassis is assembled, the second plates are rotated to stand on the first plate, and the third plates are moved and rotated to stand on the first plate. The fixing elastic elements on the third plates are provided for fastening the second plates to the third plates.

The invention relates to a foldable chassis. Directly employing hooks, holes, and fixing elastic elements, the computer chassis can be assembled or folded easily and conveniently. Therefore, it is capable of lowering transportation cost and saving storage space.

These and other features, aspects and advantages of the present invention will become better understood with regard to the following description, appended claims, and accompanying drawings.

DETAILED DESCRIPTION OF THE EMBODIMENTS

Figure 1:
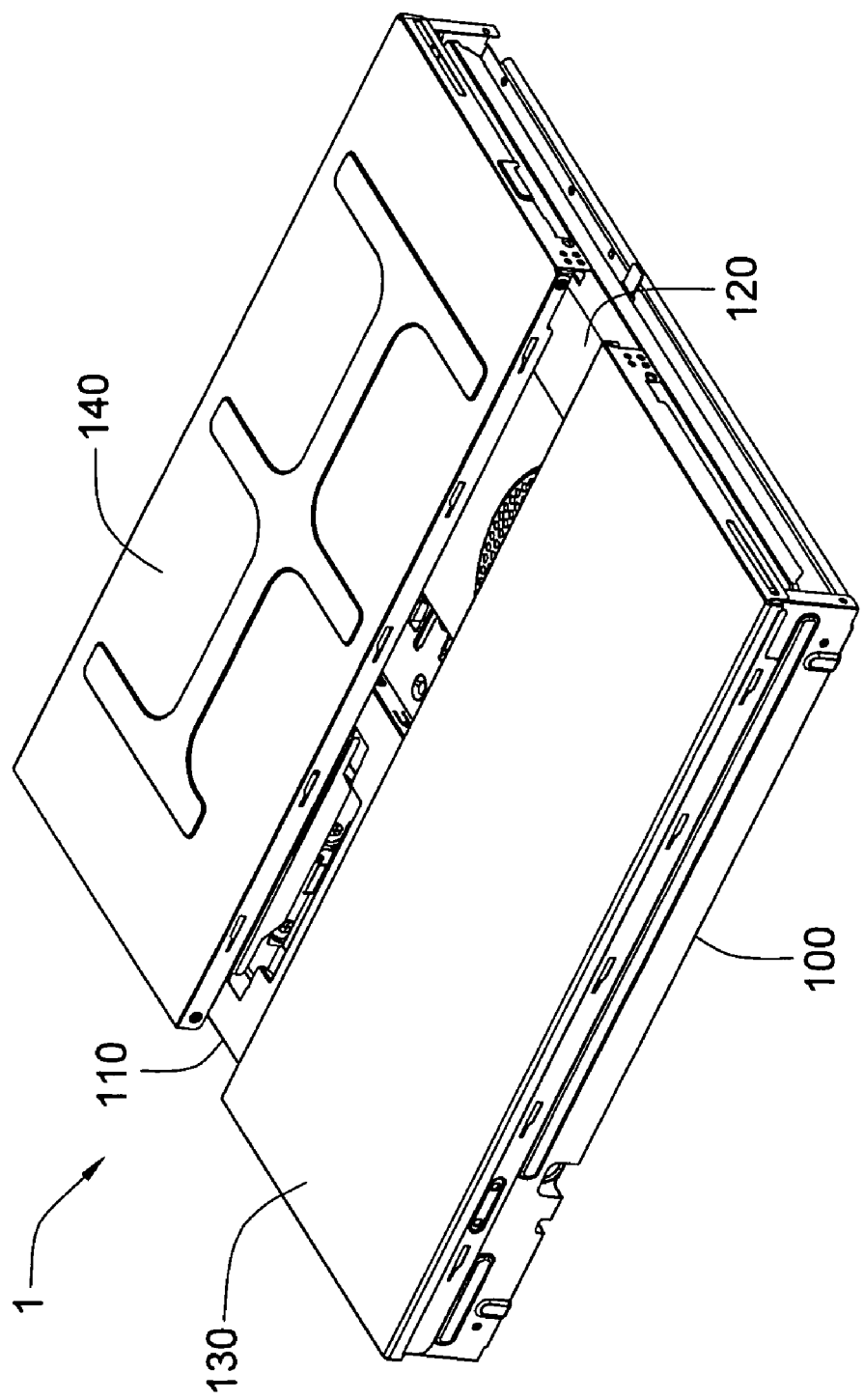
FIG. 1 is a schematic diagram showing a foldable computer chassis of a preferred embodiment in a folded state according to the present invention.

FIG. 1 is a diagram showing the foldable computer chassis of a preferred embodiment in a folded state according to the present invention. A foldable computer chassis 1 includes a first plate 100, a plurality of second plates 110 and 120, and a plurality of third plates 130 and 140. The second plates 110 and 120 are respectively connected to two opposite edges of the first plate 100, and the third plates 130 and 140 are connected to the other two opposite edges of the first plate 100, respectively. As shown in FIG. 1, when the computer chassis is folded, the third plates 130 and 140 lie on the outermost layer of the computer chassis 1, while the second plates 110 and 120 lie between the first plate 100 and the third plates 130 and 140.

Figure 2A:
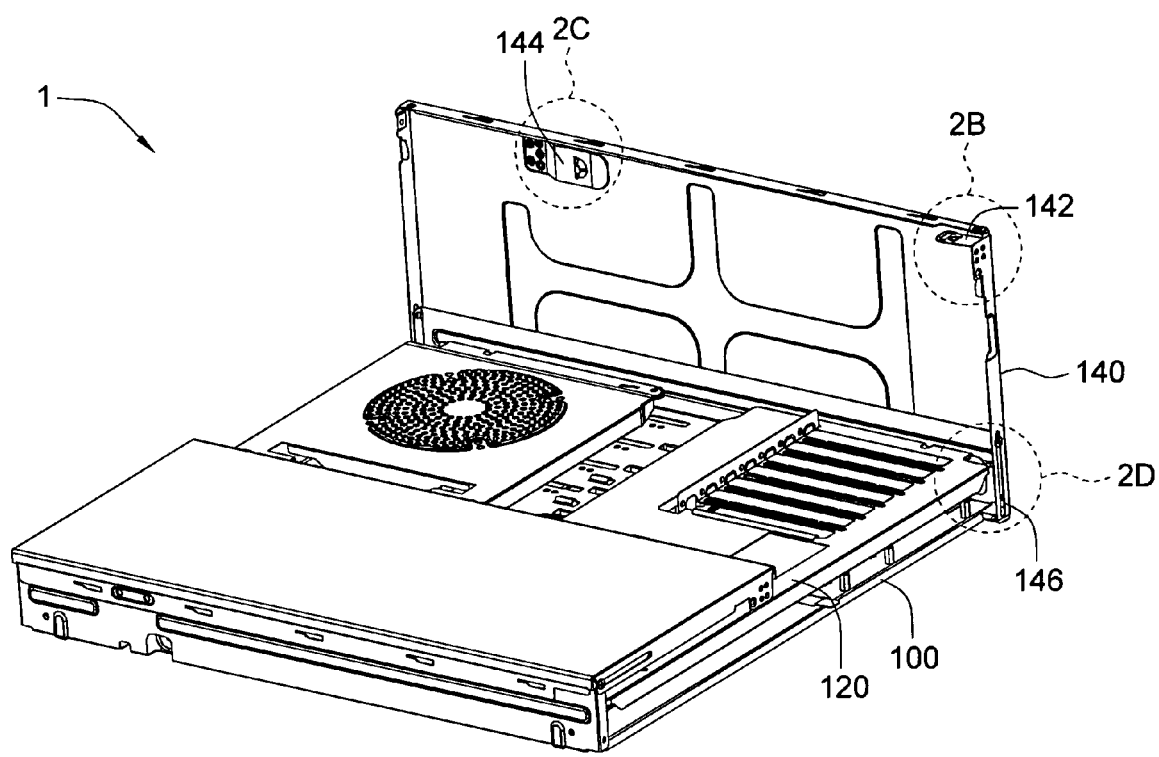
FIG. 2A is a schematic diagram showing the appearance after one of the third plates of the foldable computer chassis in FIG. 1 is open.

Referring to FIG. 2A, FIG. 2A is a schematic diagram showing the appearance after one of the third plates of the foldable computer chassis in FIG. 1 is open. The third plates 130 and 140 disposed symmetrically and are movably connected to the first plate 100. Since the third plates 130 and 140 are same in structure, herein we only specify the structure of the third plate 140. As shown in FIG. 2A, the third plate 140 has a first fixing elastic element 142 and a second fixing elastic element 144 on its margin frame unconnected to the first plate 100, and the two fixing elastic elements 142 and 144 are provided for connecting with other parts. In addition, the third plate 140 further includes two runners 146 (only one is shown due to the view factor) respectively located on two margin frames of the third plate 140, and the two runners 146 are provided for connecting the third plate 140 with the first plate 100.

Figure 2B:
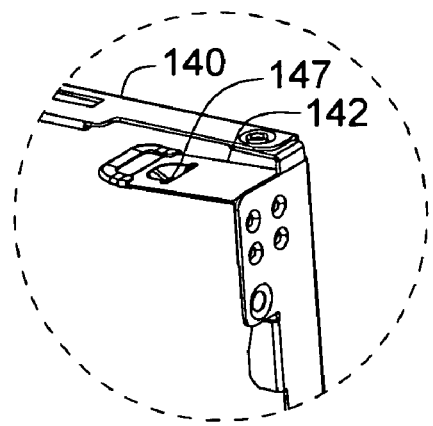
FIG. 2B is an enlarged view of the first fixing elastic element in FIG. 2A.

FIG. 2B is an enlarged view of the first fixing elastic element in FIG. 2A. As shown in FIG. 2B, the plate surface of the first fixing elastic element 142 is substantially vertical to the plate surface of the third plate 140. One end of the first fixing elastic element 142 is fixed on a margin frame of the third plate 140 and adjacent to a corner of the third plate 140 which is far away from the first plate 100 (as shown in FIG. 2A). The other end of the first fixing elastic element 142 is elastic and inclined slightly toward the first plate 100. In addition, the first fixing elastic element 142 further has a protrusion 147 protruded downwards at its elastic end for assisting to fix with other parts. The first fixing elastic element 142 is, for example, riveted on the third plate 140.

Figure 2C:
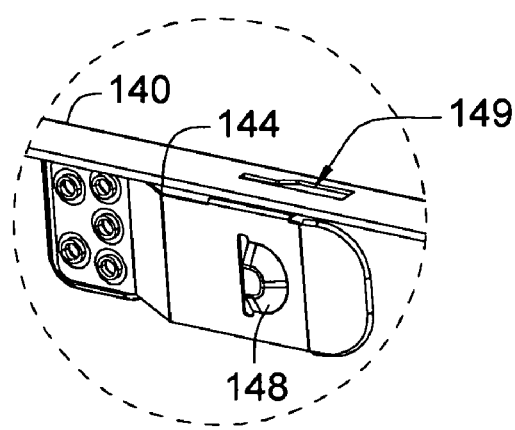
FIG. 2C is an enlarged view of the second fixing elastic element in FIG. 2A.

FIG. 2C is an enlarged view of the second fixing elastic element in FIG. 2A. As shown in FIG. 2C, the plate surface of the second fixing elastic element 144 is substantially parallel to the plate surface of the third plate 140. One end of the second fixing elastic element 144 is fixed on a margin frame of the third plate 140, and therefore the other end is elastic relative to the third plate 140. The fixing elastic element 144 also has a protrusion 148 at its elastic end for assisting to fix with other parts. In addition, one margin frame of the third plate 140 is folded inward, and a hole 149 is located on the margin frame and adjacent to the second fixing elastic element 144. The hole 149 is also provided for fixing with other parts, which will be illustrated below.

Figure 2D:
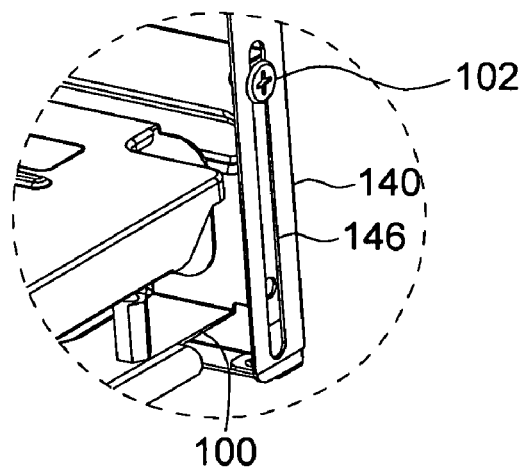
FIG. 2D is an enlarged view of the joint of the first plate and the third plate in FIG. 2A.

FIG. 2D is an enlarged view of the joint of the first plate and the third plate in FIG. 2A. As shown in the FIG. 2D, a fixing shaft 102 is disposed on the first plate 100, and preferably, it is disposed adjacently to the joint of any two edges of the first plate 100. The fixing shaft 102 is provided for connecting with the runner 146 of the third plate 140, and therefore the third plate 140 may be slidingly moved and rotated relative to the first plate 100.

Figure 3:
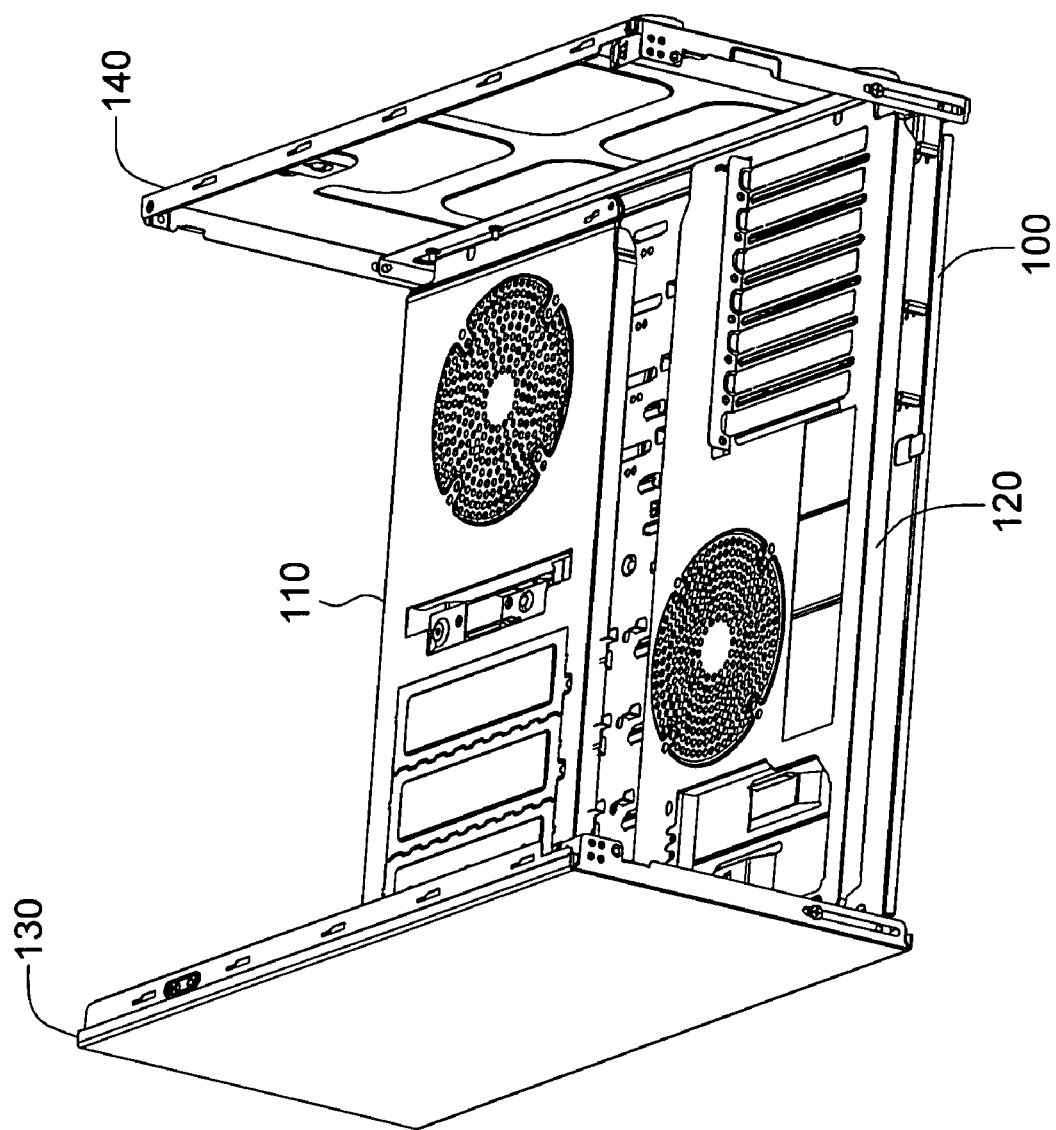
FIG. 3 is a schematic diagram showing the appearance after the two third plates in FIG. 1 are open.

Referring to FIG. 3, FIG. 3 is a schematic diagram showing the appearance after the two third plates in FIG. 1 are open. As shown in the FIG. 3, due to the cooperation of the runner and the fixing shaft, the third plates 130 and 140 may be slidingly moved and rotated outwards relative to the first plate 100. When the third plates 130 and 140 are totally open and vertical to the first plate 100, they are respectively disposed on the opposite edges of the first plate 100, and meanwhile the second plates 110 and 120 lying on the first plate 100 are exposed.

Figure 4:
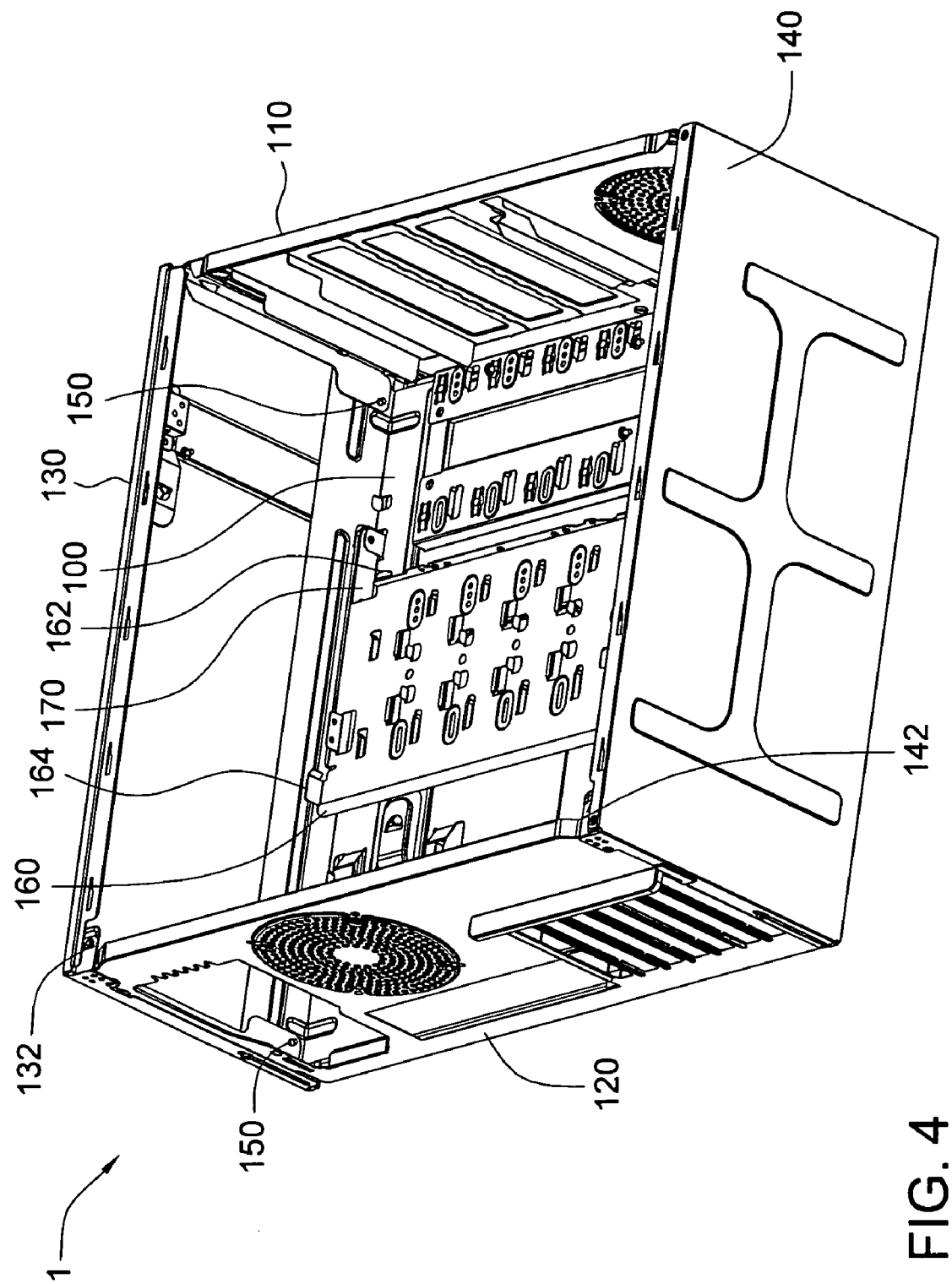
FIG. 4 is a schematic diagram showing the appearance after the two second plates in FIG. 3 are open from another viewing angle.

Referring to FIG. 4, FIG. 4 is a schematic diagram illustrating the appearance after the two second plates in FIG. 3 are open from another viewing angle. As shown in FIG. 4, the computer chassis 1 further includes a plurality of fixing shafts 150. Preferably, the fixing shafts 150 are respectively adjacent to the joints of any two edges of the first plate 100, and they are provided for connecting the first plate 100 and the second plates 110 and 120 such that the second plate 110 and 120 may be rotated relative to the first plate 100. When the second plates 110 and 120 are open, their upper margin frames are fastened by the first fixing elastic elements 132 and 142 of the third plates 130 and 140, and then they are fixed together with the third plates 130 and 140. Meanwhile, an opening 100A (referring to FIG. 5A) is formed by the four plates.

As shown in FIG. 4, the computer chassis 1 further includes a supporting bracket 160. The supporting bracket 160 lying on the first plate 100 may be movably connected to the first plate 100 to have a distance from the first plate 100 and be parallel to the first plate 100. When the computer chassis 1 is folded, the supporting bracket 160 lies between the first plate 100 and the second plates 110 and 120. The supporting bracket 160 includes at least two hooks 162 for connecting with the second plate 110 on its outward margin frame. In addition, the supporting bracket 160 has an upwardly folded block sheet 164 at each of the two sides for connecting with the third plates 130 and 140.

The computer chassis 1 further includes at least two rotating arms 170 (only one is shown due to the view factor), and one end of the rotating arm 170 is rotatably connected to the first plate 100 while the other end is connected to the supporting bracket 160. Preferably, the two rotating arms 170 and the two third plates 130 and 140 are connected to the same two edges of the first plate 100.

Figure 5A:
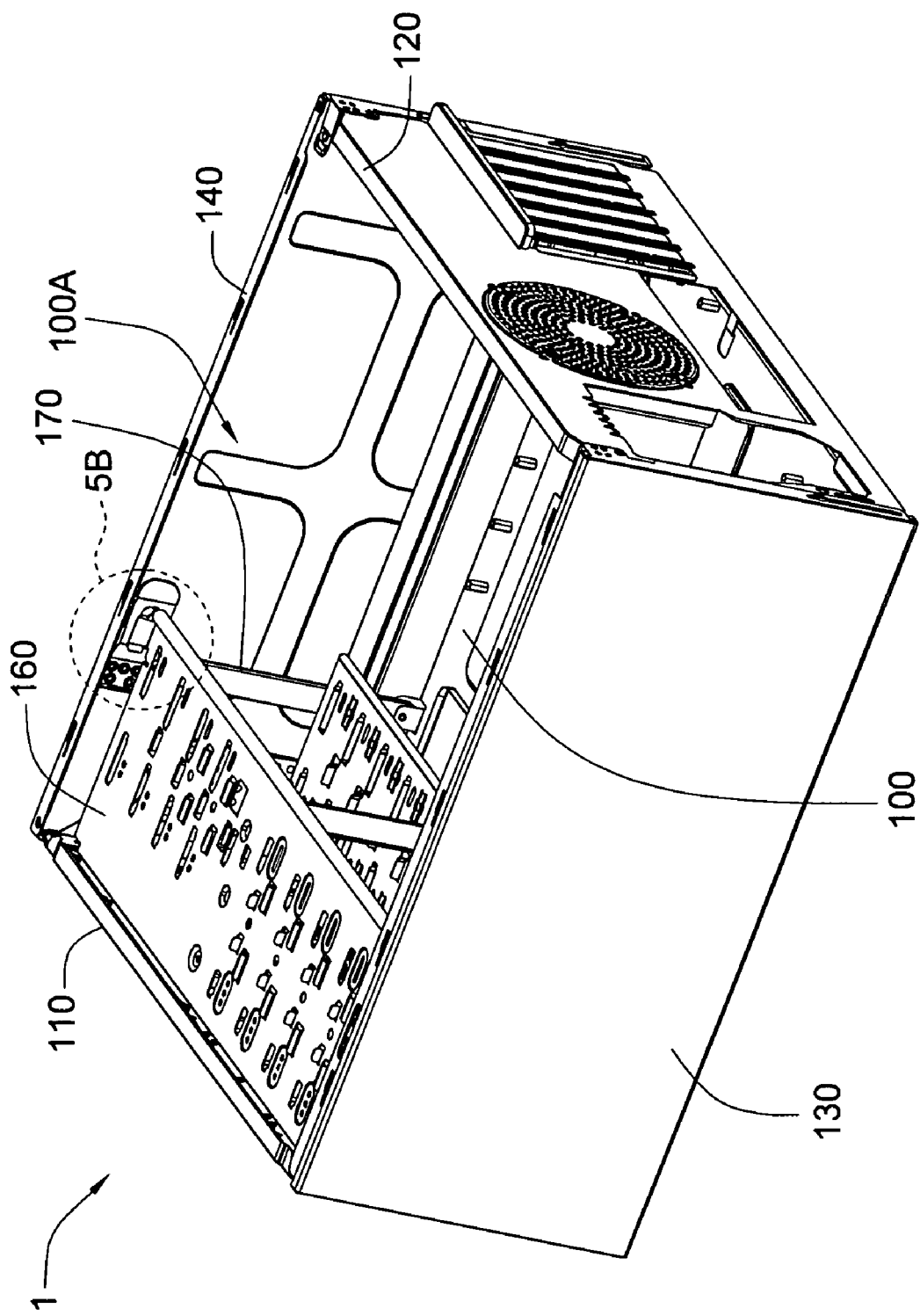
FIG. 5A is a schematic diagram showing the appearance after the supporting bracket in FIG. 4 is moved from another viewing angle.
Figure 5B:
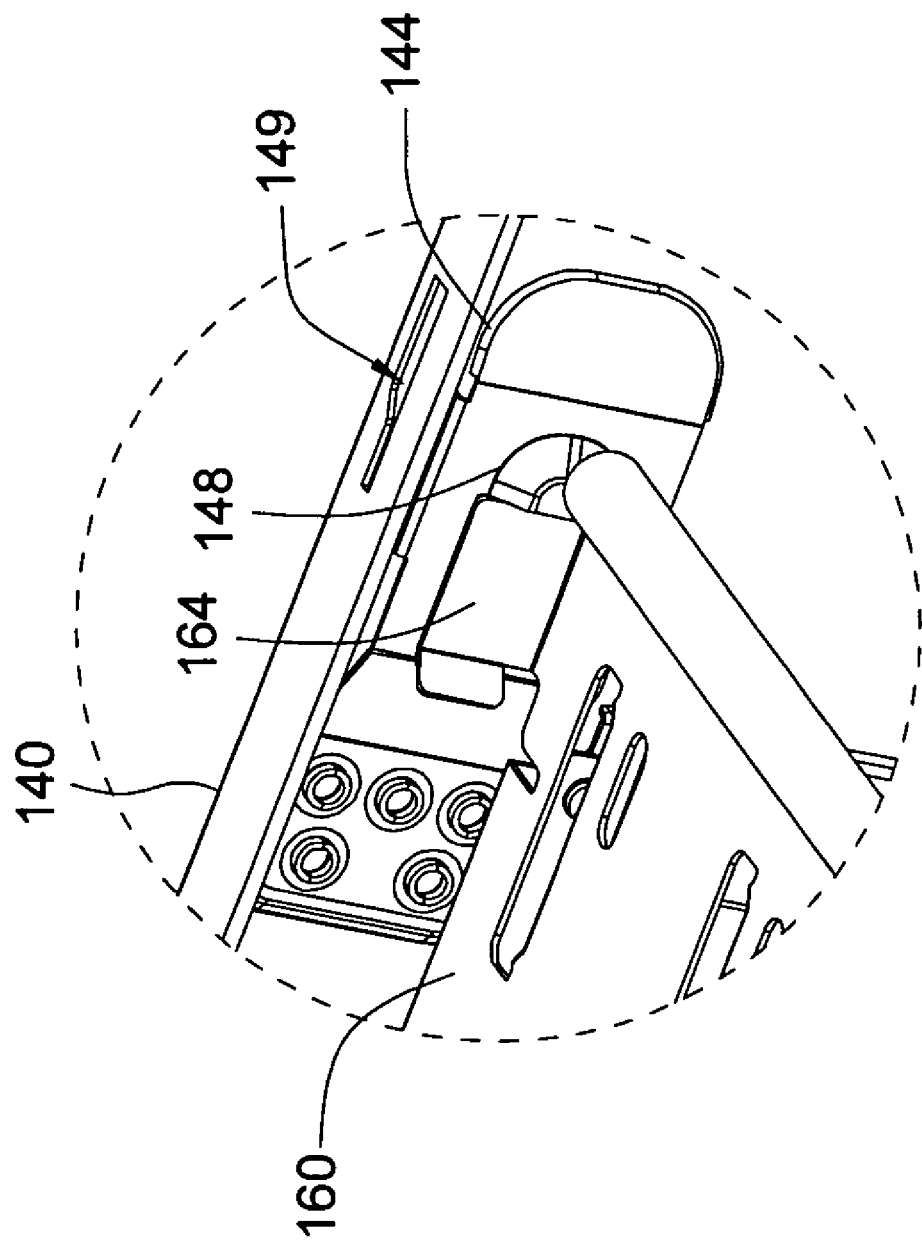
FIG. 5B is a partially enlarged view of the first fixing elastic element and the supporting bracket of FIG. 5A.

Referring to FIG. 5A, FIG. 5A is a schematic diagram showing the appearance after the supporting bracket in FIG. 4 is moved from another viewing angle; FIG. 5B is a partially enlarged view of the first fixing elastic element and the supporting bracket of FIG. 5A. As shown in FIG. 5A, due to the rotating arm 170, the supporting bracket 160 can move to be far away from the first plate 100 till the margin frames of the supporting bracket 160 are against the second plate 110. Meanwhile, the rotating arm 170 supports the supporting bracket 160 to allow the supporting bracket 160 to be substantially parallel to the first plate 100, and other two margin frames are fixed with the third plates 130 and 140.

When the margin frames of the supporting bracket 160 are against the second plate 1101 as shown in FIG. 5B, due to the elastic force of the second fixing elastic element 144 on the third plate 140, the block sheet 164 on the margin frame of the supporting bracket 160 is closely against the second fixing elastic element 144, and the protrusion 148 on the second fixing elastic element 144 is against the edge of the block sheet 164 to fix the supporting bracket 160. The hole 149 on the third plate 140 may be provided for connecting with another plate (such as a fourth plate 180 shown in FIG. 7), and it also may provide other force for fastening the supporting bracket 160 properly.

Figure 6:
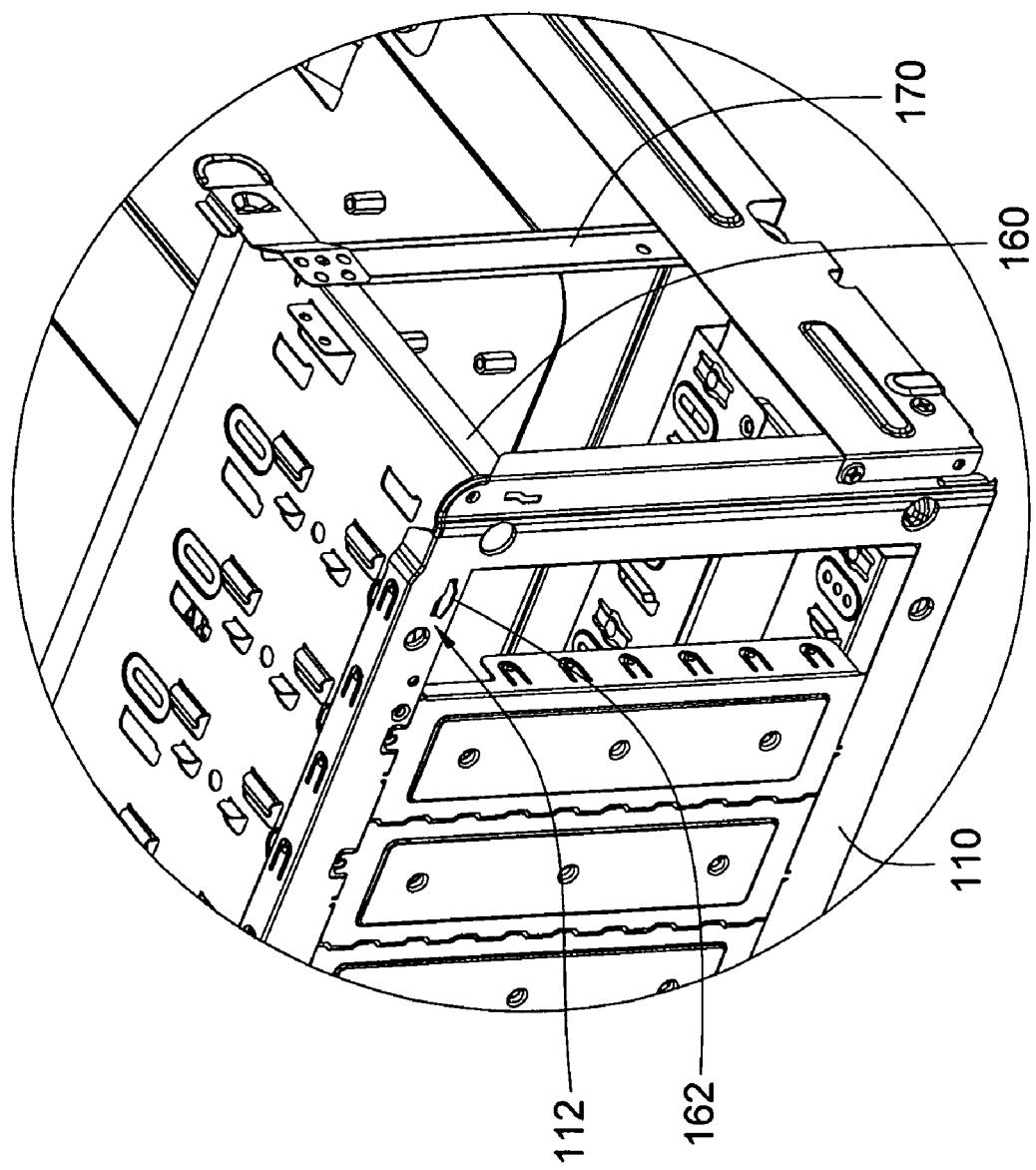
FIG. 6 is a partially enlarged view of the supporting bracket in FIG. 4 connected with the second plate from another viewing angle.

Referring to FIG. 6, FIG. 6 is a partially enlarged view of the supporting bracket in FIG. 4 connected with the second plate from another viewing angle. As shown in FIG. 6, the second plate 110 includes at least two holes 112 (herein only one is shown), and the hook 162 on the supporting bracket 160 is inserted into the hole 112 to position the supporting bracket 160 on the second plate 110.

The supporting bracket 160 may be a disk bracket. As shown in the FIG. 5A, when the whole computer chassis 1 is assembled, a motherboard, a disk driver, a power supply and a memory and other electronic elements are assembled into the computer chassis 1 via the opening 100A.

Figure 7:
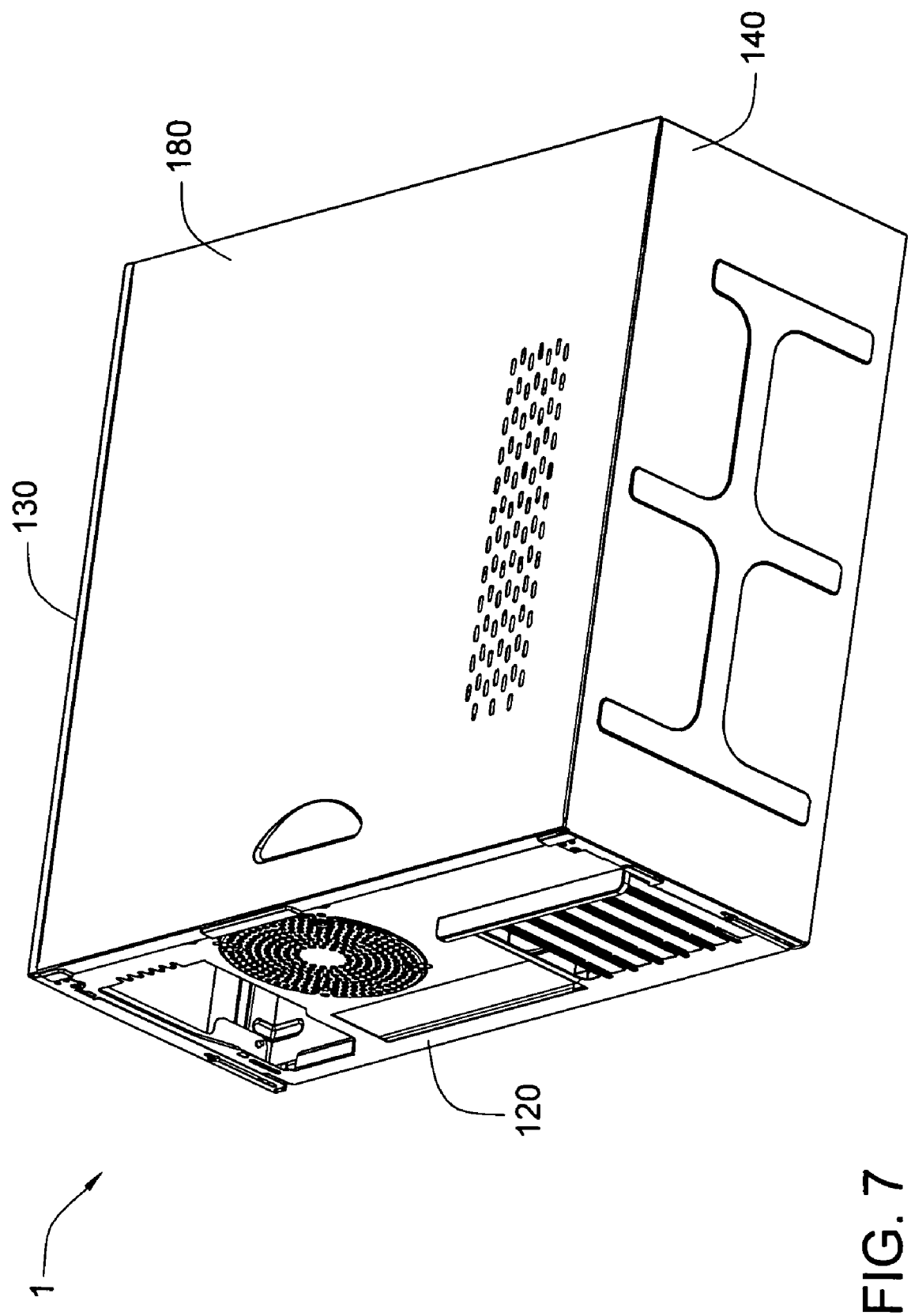
FIG. 7 is a schematic diagram showing the computer chassis in FIG. 4 covered by the fourth plate.
Figure 8:
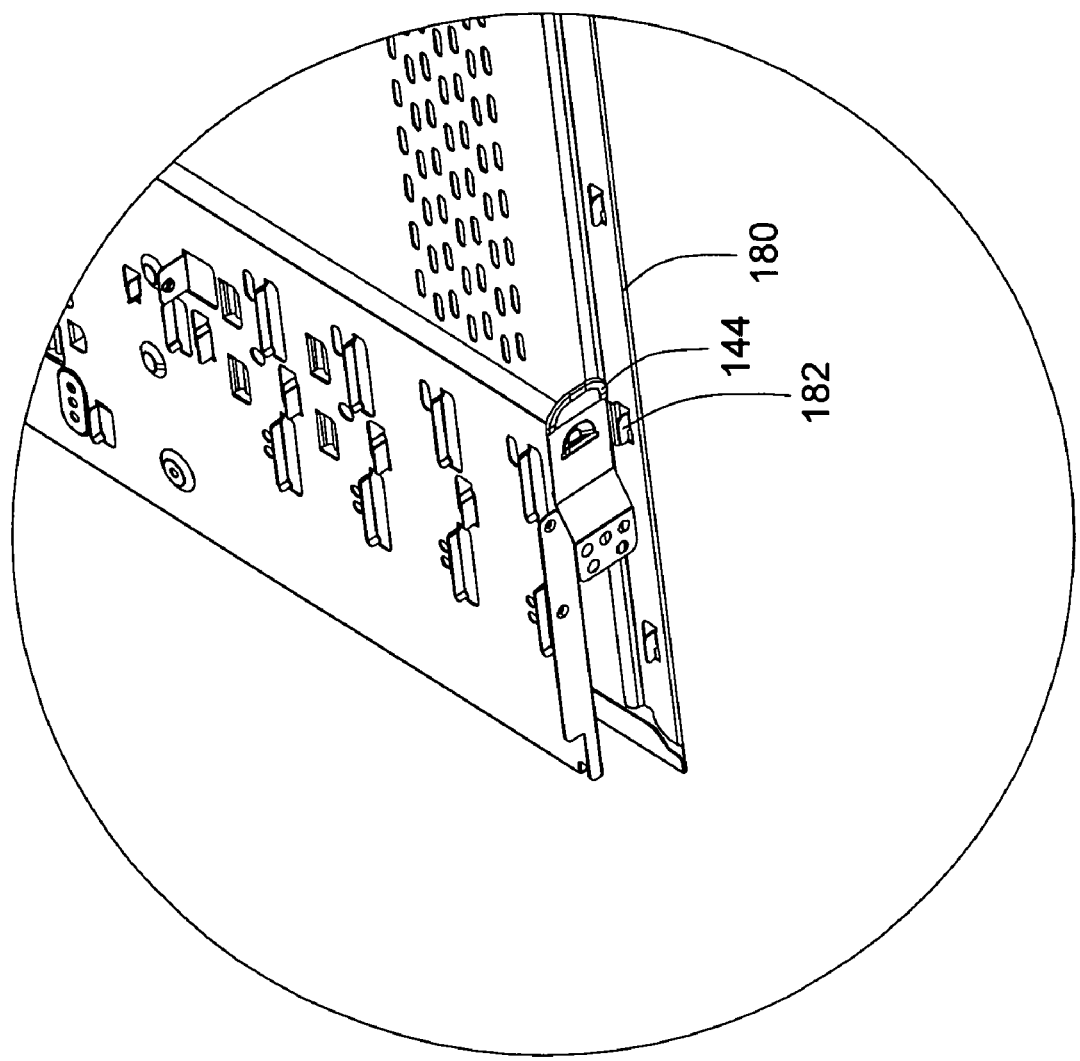
FIG. 8 is a partial view of the back side of the fourth plate and the second fixing elastic element in FIG. 7.

Referring to FIG. 7 and 8, FIG. 7 is a schematic diagram showing the computer chassis in FIG. 4 covered by the fourth plate; FIG. 8 is a partial view of the back side of the fourth plate and the second fixing elastic element in FIG. 7. As shown in FIG. 7, the computer chassis 1 has a fourth plate 180 for covering the opening 100A (as shown in FIG. 4) formed by the second plates 110 and 120 and the third plates 130 and 140. Preferably, the first plate 100 (as shown in FIG. 4) and the fourth plate 180 may be two side plates of the computer chassis 1 when the computer chassis 1 is assembled, the second plates 110 and 120 may be a front plate and a rear plate, respectively, and the third plates 130 and 140 may be a upper cover and a bottom cover, respectively.

As shown in FIG. 8, the fourth plate 180 includes a plurality of hooks 182 for passing through the holes on the third plates 130 and 140 to fix the fourth plate 180 on the third plates 130 and 140. A part of the hook 182 is, for example, inserted into the hole 149 (as shown in FIG. 5B), and after the hook 182 passes through the hole 149, the hook 182 is against the second fixing elastic element 144 toward the supporting bracket 160 (as shown in FIG. 5B). Therefore, the force for fixing the supporting bracket 160 is enhanced and the whole computer chassis 1 has a firmer structure.

Since a conventional computer chassis has an unchangeable structure which is unfoldable or cannot be minified, it's difficult to adjust the space occupied by the computer chassis occupied in transporting and storing. The embodiment in the invention discloses a foldable computer chassis which may be folded to have a minified volume, and it is capable of lowering transportation cost and saving storage space. In addition, it is convenient to assemble the computer chassis from a folded state without screws. In the embodiment of the invention, a user only need to fasten the hooks into the holes between every two plates and connect the plates with the inside supporting bracket by the fastening force of the fixing elastic elements, and then the whole structure of the computer chassis is fixed.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A foldable computer chassis, comprising:
   a first plate having a plurality of first fixing shafts and second fixing shafts;
   a plurality of second plates rotatably connected to two opposite edges of the first plate by the first fixing shafts, respectively; and
   a plurality of third plates movably and rotatably connected to the other two opposite edges of the first plate by the second fixing shafts, respectively, each of the third plates having an fixing elastic element,
   wherein as the computer chassis is folded, the second plates are rotated to lie on the first plate, and the third plates are moved and rotated to lie on the second plates; as the computer chassis is assembled, the second plates are rotated to stand on the first plate, the third plates are moved and rotated to stand on the first plate, and the first fixing elastic elements fasten the second plates with the third plates.

2. The foldable computer chassis according to claim 1, further comprising a fourth plate for covering an opening formed when the second plates and the third plates stand on the first plate.

3. The foldable computer chassis according to claim 2, wherein each of the third plates has a hole while the fourth plate has a plurality of hooks, and the hooks are connected to the holes as the computer chassis is assembled.

4. The foldable computer chassis according to claim 1, wherein each of the third plates further has two runners connected with the second fixing shafts to allow the third plates to move and rotate relative to the first plate.

5. The foldable computer chassis according to claim 4, wherein the two runners are located on two margin frames of the third plate, respectively, and the second fixing shafts are adjacent to the joint of any two edges of the first plate, respectively.

6. The foldable computer chassis according to claim 1, further comprising:
   a supporting bracket movably connected to the first plate and having a plurality of hooks for being connected to a plurality of holes of any of the second plates,
   when the computer chassis is folded, the supporting bracket lies between the first plate and the second plates, and when the computer chassis is assembled, the supporting bracket is moved and have a distance from the first plate.

7. The foldable computer chassis according to claim 6, further comprising a plurality of rotating arms, one end of each rotating arm is connected to the first plate, the other end is connected to the supporting bracket, when the rotating arms are rotated to drive the supporting bracket to move.

8. The foldable computer chassis according to claim 7, wherein the rotating arms and the third plates are connected to the same two edges of the first plate.

9. The foldable computer chassis according to claim 6, wherein each of the third plates further comprises a second fixing elastic element for fixing two margin frames of the supporting bracket when the computer chassis is assembled.

10. The foldable computer chassis according to claim 9, wherein the other elastic end of each of the second fixing elastic elements has a protrusion for abutting against the supporting bracket.

11. The foldable computer chassis according to claim 6, wherein the supporting bracket is a disk bracket.

12. The foldable computer chassis according to claim 1, wherein one end of each of the first fixing elastic elements is fixed on the margin frame of the third plate and adjacent to two corners of the third plate which are far away from the first plate, and the other end is elastic and inclined toward the first plate.

13. The foldable computer chassis according to claim 12, wherein the other elastic end of each of the first fixing elastic elements has a protrusion for abutting against the margin frame of the second plate which is vertically disposed.

* * * * *